United States Patent
Schmidt

(10) Patent No.: US 11,994,463 B2
(45) Date of Patent: *May 28, 2024

(54) NIR BROADBAND EMITTING PHOSPHORS FOR INFRARED SPECTROSCOPY

(71) Applicant: Lumileds LLC, San Jose, CA (US)

(72) Inventor: Peter Josef Schmidt, Aachen (DE)

(73) Assignee: Lumilecs LLC, San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 18/074,589

(22) Filed: Dec. 5, 2022

(65) Prior Publication Data

US 2023/0106012 A1    Apr. 6, 2023

Related U.S. Application Data

(63) Continuation of application No. 16/827,857, filed on Mar. 24, 2020, now Pat. No. 11,573,176.

(30) Foreign Application Priority Data

Apr. 12, 2019   (EP) ..................... 19168890

(51) Int. Cl.
   *C09K 11/68*    (2006.01)
   *C09K 11/62*    (2006.01)
   (Continued)

(52) U.S. Cl.
   CPC ............ *G01N 21/359* (2013.01); *C09K 11/68* (2013.01); *C09K 11/7709* (2013.01);
   (Continued)

(58) Field of Classification Search
   CPC ..... C09K 11/68; C09K 11/63; C09K 11/7712; C09K 11/7726; C09K 11/778;
   (Continued)

(56) References Cited

U.S. PATENT DOCUMENTS 10,873,011 B2 * 12/2020 Van Der Sude .......... F21K 9/90
11,508,883 B2 * 11/2022 Schmidt ................ H01L 33/504
(Continued)

FOREIGN PATENT DOCUMENTS

CN    107573937 A    1/2018
CN    108148593 A    6/2018
(Continued)

OTHER PUBLICATIONS

Machine translation of JP-2004162057-A, 13 pages. (Year: 2004).*
(Continued)

*Primary Examiner* — Matthew E. Hoban
*Assistant Examiner* — Lynne Edmondson

(57) ABSTRACT

A luminescent material is disclosed with emission in the near infrared wavelength range, the luminescent material including $Sc_{1-x-y}A_yRE:Cr_x$, wherein $MO=P_3O_9$, $BP_3O_{12}$, $SiP_3O_{12}$; A=Lu, In, Yb, Tm, Y, Ga, Al, where $0 \le x \le 0.75$, $0 \le y \le 0.9$. A wavelength converting structure including the luminescent phosphor is also disclosed.

13 Claims, 12 Drawing Sheets

(51) Int. Cl.
*C09K 11/63* (2006.01)
*C09K 11/77* (2006.01)
*G01N 21/359* (2014.01)
*H01L 33/50* (2010.01)

(52) U.S. Cl.
CPC ........ *C09K 11/7795* (2013.01); *H01L 33/504* (2013.01); *H01L 33/505* (2013.01)

(58) Field of Classification Search
CPC . C09K 11/62; C09K 11/7709; C09K 11/7795; H01L 33/502; H01L 33/504
See application file for complete search history.

(56) References Cited

U.S. PATENT DOCUMENTS

| | | | |
|---|---|---|---|
| 11,573,176 | B2 | 2/2023 | Schmidt |
| 2020/0048549 | A1 | 2/2020 | Hong |

FOREIGN PATENT DOCUMENTS

| | | | |
|---|---|---|---|
| JP | 2004162057 A | * | 6/2004 |
| JP | 2013110155 A | * | 6/2013 |
| JP | 2019-189721 A | | 10/2019 |
| WO | 2018/207703 A1 | | 11/2018 |
| WO | 2020/207773 A1 | | 10/2020 |

OTHER PUBLICATIONS

Machine translation of JP-2013110155-A, 11 pages. (Year: 2013).*
Machine translation of CN105753937A, 8 pages. (year 2018).
European Search Report, EP Application No. 19168890 filed Apr. 12, 2019, 1 page.
E.W.J.L. Oomen et al., Luminescence of Bi3+ in the Metaphosphates LnP3O9 (Ln = Sc, Lu, Y, Gd, La), Journal of Solid State Chemistry 75, 201-204 (1998).
Rajendran et al., "(INVITED) Recent progress on broadband near-infrared phosphors-converted light emitting diodes for future miniature spectrometers", Optical Materials: X (2019), 11 pages.
Shao, et al., Photoluminescence properties of a ScBO3 :Cr3+ phosphor and its applications for broadband near-infrared LEDs, RSC Advances, vol. 8, No. 22, Jan. 1, 2018, pp. 12035-12042.
Thauern et al., "Second-Sphere Ligand-Field Effects in Solid Solutions of Anhydrous Transition-Metal Phosphates", Inorganic Chemistry, vol. 46, No. 6, 2007, pp. 2057-2066.
From the EPO as the ISA, "Notification of Transmittal of the International Search Report and the Written Opinion of the International Searching Authority, or the Declaration", PCT/EP2020/057939, dated Jul. 17, 2020, 13 pages.
Extended European search report, EP19168890.2, dated Oct. 1, 2019, 5 pages.

* cited by examiner

NIR BROADBAND EMITTING PHOSPHORS FOR INFRARED SPECTROSCOPY

CROSS-REFERENCE TO RELATED APPLICATIONS

This application is a continuation of U.S. patent application Ser. No. 16/827,857, filed on Mar. 24, 2020, which claims benefit of priority to European Patent Application 19168890.2 filed Apr. 12, 2019. Each of the foregoing applications is incorporated herein by reference in their entirety.

FIELD OF THE INVENTION

The invention relates to a luminescent material and to a wavelength converting structure.

BACKGROUND

Oomen et al. (J. Solid State Chemistry, vo. 75 no 1 (1988), 201-204), describe the luminescence of the $Bi^{3+}$ ion ($6s^2$) in the metaphosphates $LnP_3O_9$ (Ln=Sc, Lu, Y, Gd, La). For Ln=Sc, Lu, Y, Gd the metaphosphates have a monoclinic structure with four slightly different sites for the trivalent cations. For Ln=Sc, Lu, Y the Stokes shift of the $Bi^{3+}$ luminescence increased with increasing radius of the host lattice cation. Concentration quenching of the $Bi^{3+}$ luminescence is observed. In the case of $GdP_3O_9$—$Bi^{3+}$ the excitation energy is transferred to the $Gd^{3+}$ ions. $LaP_3O_9$ adopts an orthorhombic structure with only one site available for the trivalent cations. The different coordination of the $Bi^{3+}$ ion leads to a large increase of the Stokes shift of the $Bi^{3+}$ luminescence. Oomen et al. also reported on the luminescence of the $5s^2$ ion $Sb^{3+}$ in $LnP_3O_9$ (Ln=Sc, Lu, Y, Gd, La).

Qiyue Shao et al., RSC. Adv., 8 (2018), 12035-12042, indicate that rapid extension of solid state lighting technologies offers the possibility to develop broadband near-infrared (NIR) phosphor-converted LEDs (pc-LEDs) as novel NIR light sources. In this paper, it is indicated that a NIR-emitting phosphor $ScBO_3:Cr^{3+}$ was synthesized by a high temperature solid state reaction method. Phase structure, spectroscopic properties, luminescent lifetime, quantum yield, emitter concentration influences and thermal quenching behavior of $ScBO_3:Cr^{3+}$, as well as its applications for NIR pc-LEDs, were investigated. $ScBO_3:Cr^{3+}$ phosphors exhibit a broad absorption band ranging from 400 to 530 nm, which matches well with the characteristic emission of the blue LED chip. Moreover, $Cr^{3+}$ ions occupy the $Sc^{3+}$ sites with relatively low crystal field strength in the $ScBO_3$ host, and therefore $ScBO_3:Cr^{3+}$ phosphors show intense broadband emission peaking at ~800 nm upon excitation at 460 nm, originating from spin-allowed $^4T_2 \rightarrow ^4A_2$ transition of $Cr^{3+}$ ions. The optimum $Cr^{3+}$ concentration was determined to be ~2 mol % with a quantum yield of ~65%. A broadband NIR pc-LED prototype device was fabricated by the combination of $ScBO_3:Cr^{3+}$ phosphors and a blue LED chip, which showed a maximum NIR light output power of ~26 mW and a corresponding energy conversion efficiency of ~7%.

Veeramani Rajendran et al., Optical Materials X, 1 (2019), 100011, indicate that the development of phosphor-converted technology-based broadband near-infrared light source for miniature spectrometers to perform spectroscopy applications has recently attracted remarkable attention among researchers in the academe and industry. The transition metal element $Cr^{3+}$-activated luminescent materials act as the potential candidates to meet the demands for increased near-infrared light spectral distribution. In this document, the most recently developed broadband near-infrared phosphors activated by $Cr^{3+}$ are listed and classified according to their major chemical element constituents. In addition to the luminescence mechanism of $Cr^{3+}$, the association between the number of crystallographic sites and spectral distribution of near-infrared light is mainly reviewed with the example of known near-infrared phosphors, which may be helpful in exploring future broadband near-infrared phosphors. The performance-evaluating parameters of phosphor-converted near-infrared light-emitting diode are discussed and compared with those of known broadband near-infrared phosphors for spectroscopy applications.

SUMMARY OF THE INVENTION

Semiconductor light emitting diodes and laser diodes (collectively referred to herein as "LEDs") are among the most efficient light sources currently available. The emission spectrum of an LED typically exhibits a single narrow peak at a wavelength determined by the structure of the device and by the composition of the semiconductor materials from which it is constructed. By suitable choice of device structure and material system, LEDs may be designed to operate at ultraviolet, visible, or infrared wavelengths.

LEDs may be combined with one or more wavelength converting materials (generally referred to herein as "phosphors") that absorb light emitted by the LED and in response emit light of a longer wavelength. For such phosphor-converted LEDs ("pcLEDs"), the fraction of the light emitted by the LED that is absorbed by the phosphors depends on the amount of phosphor material in the optical path of the light emitted by the LED, for example on the concentration of phosphor material in a phosphor layer disposed on or around the LED and the thickness of the layer.

Phosphor-converted LEDs may be designed so that all of the light emitted by the LED is absorbed by one or more phosphors, in which case the emission from the pcLED is entirely from the phosphors. In such cases the phosphor may be selected, for example, to emit light in a narrow spectral region that is not efficiently generated directly by an LED.

Alternatively, pcLEDs may be designed so that only a portion of the light emitted by the LED is absorbed by the phosphors, in which case the emission from the pcLED is a mixture of light emitted by the LED and light emitted by the phosphors. By suitable choice of LED, phosphors, and phosphor composition, such a pcLED may be designed to emit, for example, white light having a desired color temperature and desired color-rendering properties.

In an aspect, the invention provides a luminescent material comprising $Sc_{1-x-y}A_yMO:Cr_x$, wherein $MO=P_3O_9$, $(BP_3O_{12})_{0.5}$, $(SiP_5O_{19})_{0.34}$; A=Lu, In, Yb, Tm, Y, Ga, Al, where $0 \leq x \leq 0.75$, $0 \leq y \leq 2$.

In embodiments, MO is $P_3O_9$ and $0 \leq x \leq 0.5$, $0 \leq y \leq 0.9$. Especially, x is larger than 0. Hence, especially $0 < x$. Further, in embodiments $0 \leq y \leq 1$. In specific embodiments, $0 < x+y \leq 1$. Especially, $x > 0$ (in view of the availability of $Cr^{3+}$). Especially, in embodiments $0 \leq y \leq 1$. As x is especially larger than 0, y is especially smaller than 1. Hence, in embodiments $0 \leq y < 1$. Especially, in further embodiments $0 \leq y \leq 0.9$. Therefore, in embodiments $0 < x \leq 0.75$, and $0 \leq y \leq 0.9$. In specific embodiments, $0 < x \leq 0.5$, and $0 \leq y \leq 0.9$.

In embodiments, MO is $(BP_3O_{12})_{0.5}$ and $0 \leq x \leq 0.75$, $0 \leq y \leq 1.8$. Especially, x is larger than 0. Hence, especially $0 < x$. Further, in embodiments $0 \leq y \leq 1$. In specific embodiments, $0<x+y\leq 1$. Especially, $x>0$ (in view of the availability of $Cr^{3+}$). Especially, in embodiments $0\leq y\leq 1$. As x is especially larger than 0, y is especially smaller than 1. Hence, in embodiments $0\leq y<1$. Especially, in further embodiments $0\leq y\leq 0.9$. Therefore, in embodiments $0<x\leq 0.75$, and $0\leq y\leq 0.9$. In specific embodiments, $0<x\leq 0.5$, and $0\leq y\leq 0.9$.

In embodiments, MO is $(SiP_5O_{19})_{0.34}$ and $0\leq x\leq 0.2$, $0\leq y\leq 2$. Especially, x is larger than 0. Hence, especially $0<x$. Further, in embodiments $0\leq y\leq 1$. In specific embodiments, $0<x+y\leq 1$. Especially, $x>0$ (in view of the availability of $Cr^{3+}$). Especially, in embodiments $0\leq y\leq 1$. As x is especially larger than 0, y is especially smaller than 1. Hence, in embodiments $0\leq y<1$. Especially, in further embodiments $0\leq y\leq 0.9$. Therefore, in embodiments $0<x\leq 0.2$, and $0\leq y\leq 0.9$. In specific embodiments, $0<x\leq 0.2$, and $0\leq y\leq 0.9$.

In embodiments, y=0. Especially, in alternative embodiments y is larger than 0, like at least 0.01, such as at least 0.02, like at least 0.05, such as at least 0.1.

Further, in specific embodiments A comprises one or more of In, Ga, and Al, such as one or more of In and Ga, like at least In. In alternative embodiments, A comprises at least Lu.

In embodiments, the luminescent material emits light having a peak wavelength in a range of 700 nm to 1100 nm.

In an aspect, the invention provides a phosphor material including at least one of $Sc_{1-x-y}A_yMO:Cr_x$, wherein $MO=BO_3$, $P_3O_9$, $(BP_3O_{12})_{0.5}$, $(SiP_5O_{19})_{0.34}$; A=Lu, In, Yb, Tm, Y, Ga, Al, where $0<x\leq 0.75$, $0\leq y\leq 2$ (especially $0\leq y\leq 1$), and wherein when $MO=BO_3$, $0<y$ (i.e. y>0). In embodiments, the invention provides a phosphor material including at least one of $Sc_{1-x-y}A_yMO:Cr_x$, wherein $MO=P_3O_9$, $(BP_3O_{12})_{0.5}$, $(SiP_5O_{19})_{0.34}$; A=Lu, In, Yb, Tm, Y, Ga, Al, where $0<x\leq 0.75$, $0\leq y\leq 2$ (especially $0\leq y\leq 1$). As indicated above, especially x is larger than 0. Hence, especially $0<x$. Further, as indicated above in embodiments $0\leq y\leq 1$. In specific embodiments, $0<x+y\leq 1$. Especially, $x>0$ (in view of the availability of $Cr^{3+}$). Especially, in embodiments $0\leq y\leq 1$. As x is especially larger than 0, y is especially smaller than 1. Hence, in embodiments $0\leq y\leq 1$. Especially, in further embodiments $0\leq y\leq 0.9$. Therefore, as indicated above, in embodiments $0<x\leq 0.75$, and $0\leq y\leq 0.9$. In specific embodiments, $0<x\leq 0.5$, and $0\leq y\leq 0.9$. In embodiments wherein MO is $(SiP_5O_{19})_{0.34}$, especially $0\leq x\leq 0.2$, $0\leq y\leq 1$ applies.

In yet a further aspect, the invention provides a wavelength converting structure comprising an NIR phosphor material, the NIR phosphor material including at least one of $Sc_{1-x-y}A_yMO:Cr_x$, wherein $MO=BO_3$, $P_3O_9$, $(BP_3O_{12})_{0.5}$, $(SiP_5O_{19})_{0.34}$; A=Lu, In, Yb, Tm, Y, Ga, Al, where $0\leq x\leq 0.75$, $0\leq y\leq 2$. As indicated above, especially x is larger than 0. Hence, especially $0<x$. Further, as indicated above in embodiments $0\leq y\leq 1$. In specific embodiments, $0<x+y\leq 1$. Especially, $x>0$ (in view of the availability of $Cr^{3+}$). Especially, in embodiments $0\leq y\leq 1$. As x is especially larger than 0, y is especially smaller than 1. Hence, in embodiments $0\leq y<1$. Especially, in further embodiments $0\leq y\leq 0.9$. Therefore, as indicated above, in embodiments $0<x\leq 0.75$, and $0\leq y\leq 0.9$. In specific embodiments, $0\leq x\leq 0.5$, and $0\leq y\leq 0.9$. In embodiments wherein MO is $(SiP_5O_{19})_{0.34}$, especially $0\leq x\leq 0.2$, $0\leq y\leq 1$ applies.

In embodiments, when $MO=BO_3$, $0<y$.

As indicated above, especially, x is larger than 0. Hence, especially $0<x$. Therefore, in embodiment $0<x\leq 0.75$, and $0\leq y<1$, such as $0\leq y\leq 0.9$.

In embodiments, the wavelength converting structure further comprising a light source emitting a first light, the wavelength converting structure disposed in a path of the first light, wherein the NIR phosphor absorbs the first light and emits a second light, the second light having a wavelength range of 700 nm to 1100 nm.

In embodiments, the wavelength converting structure further comprising a second phosphor material, wherein the second phosphor material includes at least one of a green phosphor, a red phosphor, and an IR phosphor.

In embodiments, the wavelength converting structure wherein MO is $P_2O_9$ and $0<x\leq 0.5$, $0\leq y\leq 0.9$.

In embodiments, the wavelength converting structure wherein MO is $(BP_3O_{12})_{0.5}$ and $0<x\leq 0.75$, $0\leq y\leq 1.8$. Hence, especially x is larger than 0. Hence, especially $0<x$. Further, as indicated above in embodiments $0\leq y\leq 1$. In specific embodiments, $0<x+y\leq 1$. Especially, $x>0$ (in view of the availability of $Cr^{3+}$). Especially, in embodiments $0\leq y\leq 1$. As x is especially larger than 0, y is especially smaller than 1. Hence, in embodiments $0\leq y<1$. Especially, in further embodiments $0\leq y\leq 0.9$. Therefore, as indicated above, in embodiments $0<x\leq 0.75$, and $0\leq y\leq 0.9$. In specific embodiments, $0\leq x\leq 0.5$, and $0\leq y\leq 0.9$.

In embodiments, the wavelength converting structure wherein MO is $(SiP_5O_{19})_{0.34}$ and $0<x\leq 0.2$, $0\leq y\leq 2$. As indicated above, especially x is larger than 0. Hence, especially $0<x$. Further, as indicated above in embodiments $0\leq y\leq 1$. In specific embodiments, $0<x+y\leq 1$. Especially, $x>0$ (in view of the availability of $Cr^{3+}$). Especially, in embodiments $0\leq y\leq 1$. As x is especially larger than 0, y is especially smaller than 1. Hence, in embodiments $0\leq y<1$. Especially, in further embodiments $0\leq y\leq 0.9$. Therefore, as indicated above, in embodiments $0<x\leq 0.75$, and $0\leq y\leq 0.9$. In specific embodiments, $0<x\leq 0.5$, and $0\leq y\leq 0.9$.

In embodiments, the wavelength converting structure wherein MO is $BO_3$, $0<x\leq 0.5$, y>0 and $y\leq 0.9$. In embodiments, the wavelength converting structure wherein the MO is $BO_3$, A is Lu and $0.05\leq y\leq 0.25$ and $0.01\leq x\leq 0.06$.

In embodiments, a wavelength converting structure is provided wherein the NIR phosphor includes at least one of $Sc_{0.98-x}Lu_xBO_3:Cr_{0.02}$ (x=0, 0.2, 0.3), $Sc_{1-x}P_3O_9:Cr_x$ (x=0.02, 0.04, 0.08), $Sc_{2-x-y}Ga_yBP_3O_{12}:Cr_x$ (x=0.04, y=0.0; x=0.08, y=0.0; x=0.8, y=0.96), and $Sc_{2.88}SiP_5O_{19}:Cr_{0.12}$. In embodiments, of the wavelength converting structure the NIR phosphor includes 5 wt % $Sc_{0.98}BO_3:Cr_{0.02}$ and 95 wt % $Sc_{1.92}BP_3O_{12}:Cr_{0.08}$.

In specific embodiments, the phosphor material comprises $Sc_{1-x-y}A_yMO:Cr_x$, wherein $MO=BO_3$, wherein $0<x\leq 0.75$, $0<y\leq 1$ (thus especially in fact $0<y<1$). Hence, the compound comprises at least one of Lu, In, Yb, Tm, Y, Ga, Al. In further specific embodiments, A at least comprises In. Yet further, in specific embodiments, the phosphor material comprises $Sc_{1-x-y-z}A_yMA'_zMO:Cr_x$, wherein $MO=BO_3$, wherein $0<x\leq 0.75$; $0<y<1$; $0\leq z\leq 1$; $0<y+z<1$; wherein A=In, and wherein A'=Lu, Yb, Tm, Y, Ga, Al. Especially, in embodiments z=0. In other embodiments, z>0.

Instead of the term "luminescent material" also the term "phosphor material" may be applied.

The phosphor may comprise a combination of two or more of the herein described phosphors. Two phosphors having the same general formula, but having a different composition for A may be different phosphors. For instance, $Sc_{1-x-y}Lu_yBO_3:Cr_x$ may differ from $Sc_{1-x-y}In_yBO_3:Cr_x$ especially in terms of spectral characteristics.

Figure 1:
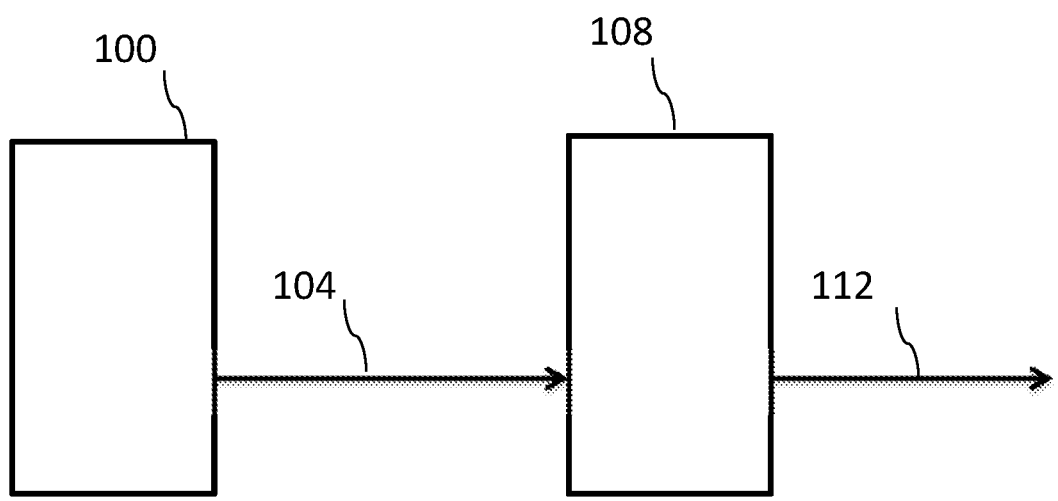
FIG. 1 illustrates an embodiment of a wavelength converting structure as part of an illumination device.

Schematic drawings are not necessarily to scale.

DETAILED DESCRIPTION

This specification discloses luminescent materials that are phosphors that can emit near-infrared (NIR) radiation, and devices that include a wavelength converting structure formed from the luminescent materials that are phosphors that can emit NIR radiation. The luminescent materials that are phosphors that can emit NIR radiation may be referred to herein as "NIR phosphors," "NIR phosphor materials," and/or "NIR phosphor compositions." For economy of language, infrared rations may be referred to herein as "light."

NIR Phosphor Compositions

The luminescent materials are NIR emitting broadband phosphors that can enable pc LED light sources that have improved spectral shapes and light output levels. Higher light output levels are advantageous for many applications, including e.g., spectroscopy applications because they provide an improved signal-to-noise ratio resulting in more accurate and faster analysis.

In general, Cr(III) doped phosphors are suitable downconversion materials for pcLEDs that emit in the NIR region ("pc-NIR LEDs") because of the relatively intense absorption bands in the blue to red spectral range and the large Stokes shift that leads to broad band emission in the NIR spectral range. While Cr(III) is often incorporated on octahedral Ga(III) sites in the host lattices, for example gallium garnet phosphors like $Gd_3Ga_5O_{12}:Cr$ or in $La_3(Ga,Al)_5(Ge,Si)O_{14}:Cr$ type phosphors, incorporation on larger octahedral Sc(III) can further shift the broadband Cr(III) emission towards longer wavelengths.

This specification discloses new NIR phosphor compositions from the class of Cr(III) doped scandium phosphates, borates, borophosphates, and borosilicates that are characterized by acidic oxygen ligands surrounding the dopant. While not wanting to be bound by any particular theory, it is believed by the inventor that the acidity is caused by the strong bonding towards the small and highly charged $P^{5+}$, $Si^{4+}$ and $B^{3+}$ ions. As a consequence the antibonding character towards the higher energy Cr(III) d states is being reduced, and results in smaller Stokes shifts and higher thermal stability of the emission compared to broadband NIR gallate, germanate or aluminate phosphors.

In particular, borates of composition $REBO_3$, phosphates of composition $REP_3O_9$, borophosphates of composition $(RE)_2BP_3O_{12}$, and silicophosphates of the composition $(RE)_3SiP_5O_{19}$ are disclosed. Specifically RE may be a trivalent cation that occupies an octrahedrally coordinated lattice site. RE may be chosen from the group of Sc and Cr.

To adjust the absorption and emission properties of the Cr(III) doped scandium phosphates, borates, borophosphates, and borosilicates, a portion of the Sc can either be replaced by larger sized trivalent Lu, In, Yb, Tm or Y to obtain a spectroscopic shift towards longer wavelength, or by smaller sized trivalent Ga or Al to induce a spectroscopic shift towards shorter wavelength. In this way, a broad coverage of the NIR emission wavelength range from 700-1200 nm can be obtained by combining the NIR phosphor materials with III-V type primary LEDs that show emission in the blue, cyan, green or red spectral range.

$Sc_{1-x-y}A_yBO_3:Cr_x$ (A=Lu, In, Yb, Tm, Y, Ga, Al; 0<x≤0.5, 0<y≤0.9) shows emission in the 800-890 nm centroid wavelength range if, e.g., excited by blue light. $ScBO_3:Cr$ (y=0) is a phosphor material described by Blasse and Dirksen (Blasse, G. and G. J. Dirksen (1988). "Scandium borate (ScBO3) as a host lattice for luminescent lanthanide and transition metal ions." Inorganica Chimica Acta 145(2): 303-308, incorporated herein by reference in its entirety). In $ScBO_3$, which crystallizes in the calcite crystal structure type, Cr(III) experiences a weak crystal field and shows emission of the broad-band $^4T_2 \rightarrow ^4A_2$ type. Although $LuBO_3$ crystallizes in the vaterite structure type, the inventor found that part of Sc can be replaced by Lu while the calcite structure type is maintained and the emission band is further shifted to longer wavelengths. This leads to compositions according to $Sc_{1-x-y}Lu_yBO_3:Cr_x$. Preferably, 0.05≤y≤0.25 and 0.01≤x≤0.06.

Because, for some applications, broad emission bands may be preferred for phosphors applied in pc NIR LED light sources, additional doping with the smaller sized Ga(III) can be carried out. This leads to compositions according to $Sc_{1-x-y-z}Lu_yGa_zBO_3:Cr_x$. Preferably, 0.02≤y≤0.4, 0.02≤z≤0.6 and 0.01≤x≤0.06. In this case Cr(III) occupies multiple lattice sites with slightly differing sizes, eventually leading to a broadened, composed emission band.

Emission in the 880-940 nm centroid wavelength range is observed for novel $Sc_{1-x-y}A_yP_3O_9:Cr_x$ (A=Lu, In, Yb, Tm, Y, Ga, Al; 0<x≤0.5, 0≤y≤0.9) if, e.g., excited by blue light. These polyphosphate phosphors crystallize in the monoclinic C-type or $RhP_3O_9$ polyphosphate structure (Höppe, H. A. (2009). "The phase transition of the incommensurate phases β-Ln(PO3)3(Ln=Y, Tb . . . Yb), crystal structures of α-Ln(PO3)3(Ln=Y, Tb . . . Yb) and Sc(PO3)3." Journal of Solid State Chemistry 182(7): 1786-1791, incorporated herein by reference in its entirety) or in the cubic $AlP_3O_9$ or $A_4(P_3O_9)_4$ structure type where the latter is stabilized by higher firing temperatures and smaller sizes of A atoms.

Table 1 shows a comparison of the structure types of $ScP_3O_9$ with low temperature ("LT") vs high temperature ("HT") firing:

TABLE 1

Comparison of $ScP_3O_9$ structure types:

| modification | $LT\text{-}ScP_3O_9$ | $HT\text{-}ScP_3O_9$ |
|---|---|---|
| structure type | $RhP_3O_9$ | $AlP_3O_9$ |
| Space group | C 1 c 1 (No 9) | I-4 3 d (No 220) |
| No of Sc sites | 3 | 2 |
| Sc1—O (Angstr.) | 2.068-2.102 | 2.082 |
| Sc2—O (Angstr.) | 2.072-2.097 | 2.071 |
| Sc3—O (Angstr.) | 2.037-2.108 | |

The low temperature modification shows three crystallographically independent Sc sites that can be populated with Cr while the high temperature modification shows two crystallographically independent Sc sites that can be populated with Cr. The longer average contact lengths Sc—O of the former lead to low energy shifted and broadened emission bands of Cr(III) compared to the latter modification.

$Sc_{2-x-y}A_yBP_3O_{12}:Cr_x$

Emission in the centroid wavelength range 910-970 nm is observed for $Sc_{2-x-y}A_yBP_3O_{12}:Cr_x$ (A=Lu, In, Yb, Tm, Y, Ga, Al; 0<x≤0.75, 0≤y≤1.8) if, e.g., excited by green light. These Cr(III) doped borophosphate materials are characterized by face sharing $(Sc,A)_2O_9$ double octahedra. While not wanting to be bound by any particular theory, the inventor believes that Cr(III) incorporation into these uncommon host lattice units leads to the strongly shifted absorption and emission bands towards lower energies compared to host lattices where Cr(III) is incorporated into non-condensed octahedral structures. As a consequence, the body color of the claimed $Sc_{2-x-y}A_yBP_3O_{12}:Cr_x$ phosphors is red (instead of green or yellowish-green as observed for the disclosed borate and phosphate NIR phosphors).

$Sc_{2-x-y}A_yBP_3O_{12}:Cr_x$ (A=Lu, In, Yb, Tm, Y, Ga, Al; 0<x≤0.75, 0≤y≤1.8) crystallizes in the crystallographic space group P $6_3$/m (No 176), isotypic with $V_2BP_3O_{12}$ or in the same space group but isotypic to $Cr_2BP_3O_{12}$ which shows a different arrangement of the otherwise identical structural motif.

$Sc_{3-x-y}A_ySiP_5O_{19}:Cr_x$

Emission in the centroid wavelength range 910-970 nm is observed for $Sc_{3-x-y}A_ySiP_5O_{19}:Cr_x$ (A=Lu, In, Yb, Tm, Y, Ga, Al; 0<x≤0.2, 0≤y≤2) if, e.g., excited by green light. These Cr(III) doped silicophosphate materials are characterized by the same face sharing $(Sc,A)_2O_9$ double octahedra structure motif as observed for the $Sc_{2-x-y}A_yBP_3O_{12}:Cr_x$ borophosphate phosphors. The crystal structures are isotypic with $V_3SiP_5O_{19}$ ("$V_3P_5SiO_{19}$, a vanadosilicophosphate built up from $V_2O_9$ octahedra clusters, LeClaire et al." Journal of Solid Stated Chemistry, Volume 65, Issue 2, 15 Nov. 1986, Pages 168-177 (https://www.sciencedirect.com/science/article/pii/0022459686900514), incorporated by reference herein in its entirety).

Illumination Devices Including the NIR Phosphors

FIG. 1 illustrates a wavelength converting structure 108 that includes at least one of the disclosed luminescent NIR phosphor materials. Wavelength converting structure 108 is used in an illumination device 101. The light source 100 may be an LED or any other suitable source including, as examples, resonant cavity light emitting diodes (RCLEDs) and vertical cavity laser diodes (VCSELs). Light source 100 emits a first light 104. A portion of the first light 104 is incident upon a wavelength converting structure 108. The wavelength converting structure 108 absorbs the first light 104 and emits second light 112. The wavelength converting structure 108 may be structured such that little or no first light is part of the final emission spectrum from the device, though this is not required.

Due to the broad band absorbing nature in the visible spectral range that the disclosed NIR phosphor materials can be excited with, light source 100 may be, for example, blue, green or red emitting LEDs such as, for example, AlInGaN or AlInGaP or AlInGaAs LEDs.

Wavelength converting structure 108 may include, for example, one or more of the borate, phosphate, borophosphate, and silicophosphate NIR phosphor materials disclosed herein.

The wavelength converting structure 108 described with respect to FIG. 1 can be manufactured, for example, in powder form, in ceramic form, or in any other suitable form. The wavelength converting structure 108 may be formed into one or more structures that are formed separately from and can be handled separately from the light source, such as a prefabricated glass or ceramic tile, or may be formed into a structure that is formed in situ with the light source, such as a conformal or other coating formed on or above the source.

In some embodiments, the wavelength converting structure 108 may be powders that are dispersed for example in a transparent matrix, a glass matrix, a ceramic matrix, or any other suitable material or structure. NIR phosphor dispersed in a matrix may be, for example, singulated or formed into a tile that is disposed over a light source. The glass matrix may be for example a low melting glass with a softening point below 1000° C., or any other suitable glass or other transparent material. The ceramic matrix material can be for example a fluoride salt such as $CaF_2$ or any other suitable material.

The wavelength converting structure 108 may be used in powder form, for example by mixing the powder NIR phosphor with a transparent material such as silicone and dispensing or otherwise disposing it in a path of light. In powder form, the average particle size (for example, particle diameter) of the NIR phosphors may be at least 1 μm in some embodiments, no more than 50 μm in some embodiments, at least 5 μm in some embodiments, and no more than 20 μm in some embodiments. Individual NIR phosphor particles, or powder NIR phosphor layers, may be coated with one or more materials such as a silicate, a phosphate, and/or one or more oxides in some embodiments, for example to improve absorption and luminescence properties and/or to increase the material's functional lifetime.

Figure 2:
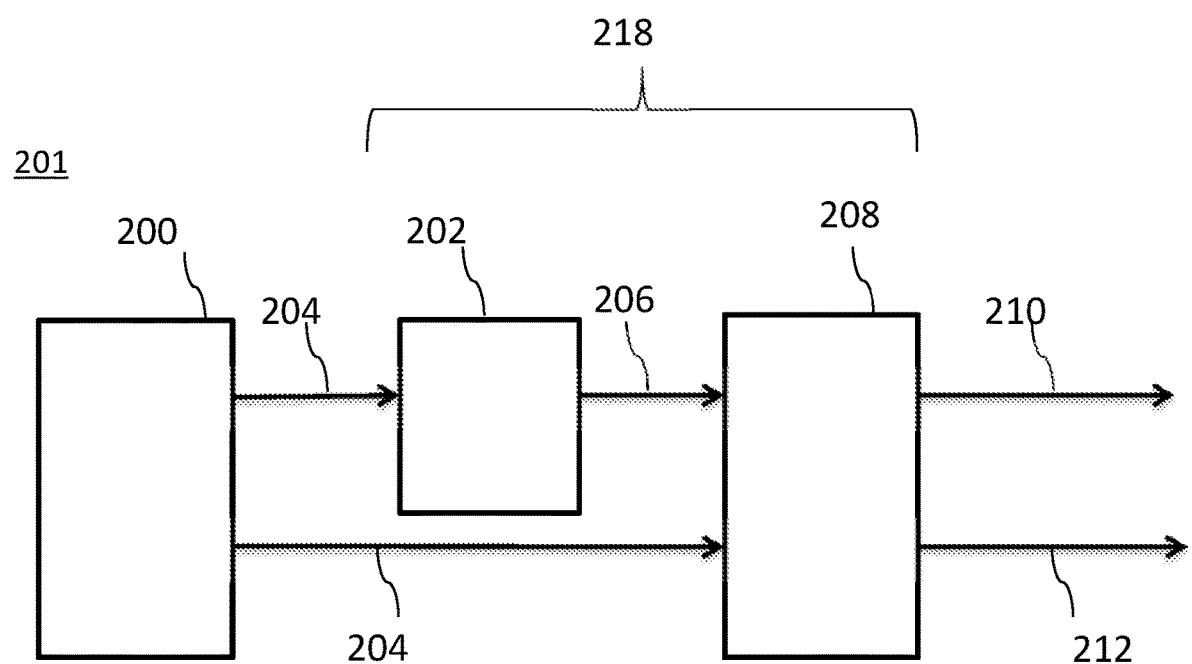
FIG. 2 illustrates another embodiment of a wavelength converting structure as part of an illumination device.

FIG. 2 illustrates another embodiment in which a wavelength converting structure including one or more of the disclosed NIR phosphor materials may further be combined with a second phosphor system. In FIG. 2, the wavelength converting structure 218 includes an NIR phosphor portion 208 and a second phosphor portion 202 as part of an illumination device 201.

In FIG. 2, a light source 200 may be an LED or any other suitable source, (including as examples resonant cavity light emitting diodes (RCLEDs) and vertical cavity laser diodes (VCSELs). Light source 200 emits first light 204. First light 204 is incident upon wavelength converting structure 218, which includes an NIR phosphor portion 208 including one or more of the NIR phosphor materials disclosed herein, and a second phosphor system 202. A portion of the first light 204 is incident on an NIR phosphor portion 208 of the wavelength converting structure 218. The NIR phosphor portion 208 absorbs the first light 204 and emits second light 212. A portion of the first light 204 is incident on a second phosphor portion 202 of the wavelength converting structure 218. The second phosphor 202 absorbs the first light 204 and emits third light 206. Third light 206 may be visible, though this is not required. The third light 206 is incident on the NIR phosphor portion 208. The NIR phosphor 208 absorbs all or a portion of the third light 206 and emits fourth light 210.

The wavelength converting structure 218 including an NIR phosphor 208 and second phosphor 202 may be structured such that little or no first light or third light is part of the final emission spectrum from the device, though this is not required.

Due to the broad band absorbing nature in the visible spectral range that the disclosed NIR phosphor materials can be excited with, light source 200 may be, for example, blue, green or red emitting LEDs such as, for example, AlInGaN or AlInGaP or AlInGaAs LEDs.

NIR phosphor 208 included in wavelength converting structure 218 may include, for example, one or more of the borate, phosphate, borophosphate, and silicophosphate NIR phosphor materials disclosed herein.

Any suitable second phosphor may be used in the second phosphor system 202. In some embodiments, the second phosphor includes one or more of a green emitting phosphor, a red emitting phosphor and an IR emitting phosphor as disclosed below.

Green Emitting Phosphors for Use as Second Phosphor

Examples of a green emitting phosphor for use in second phosphor portion 202 include $Sr_4Al_{14}O_{25}:Eu^{2+}$ and/or $A_3B_5O_{12}:Ce^{3+}$, where A is selected from the group Y, Tb, Gd, and Lu, where B is selected from the group Al, Sc and Ga. In particular, A may at least include one or more of Y and Lu, and B at least includes Al. These types of materials may give highest efficiencies. In an embodiment, the second phosphor includes at least two luminescent materials of the type of $A_3B_5O_{12}:Ce^{3+}$, where A is selected from the group Y and Lu, where B is selected from the group Al, and where the ratio Y:Lu differ for the at least two luminescent materials. For instance, one of them may be purely based on Y, such as $Y_3Al_5O_{12}:Ce^{3+}$, and one of them may be a Y,Lu based system, such as $(Y_{0.5}Lu_{0.5})_3Al_5O_{12}:Ce^{3+}$. Compositions of garnets especially include $A_3B_5O_{12}$ garnets, where A includes at least yttrium or lutetium and where B includes at least aluminum. Such garnet may be doped with cerium (Ce), with praseodymium (Pr) or a combination of cerium and praseodymium; especially however with Ce. Especially, B includes aluminum (Al), however, B may also partly comprise gallium (Ga) and/or scandium (Sc) and/or indium (In), especially up to about 20% of Al, more especially up to about 10% of Al (i.e. the B ions essentially consist of 90 or more mole % of Al and 10 or less mole % of one or more of Ga, Sc and In); B may especially comprise up to about 10% gallium. In another variant, B and 0 may at least partly be replaced by Si and N. The element A may especially be selected from the group yttrium (Y), gadolinium (Gd), terbium (Tb) and lutetium (Lu). Further, Gd and/or Tb are especially only present up to an amount of about 20% of A. In a specific embodiment, the garnet luminescent material includes $(Y_{1-x}Lu_x)_3Al_5O_{12}:Ce$, where x is equal to or larger than 0 and equal to or smaller than 1. The terms ":Ce" or ":Ce$^{3+}$" (or similar terms), indicate that part of the metal ions (i.e. in the garnets: part of the "M" ions) in the luminescent material is replaced by Ce (or another luminescent species when the term(s) would indicate that, like ":Yb"). For instance, assuming $(Y_{1-x}Lu_x)_3Al_5O_{12}:Ce$, part of Y and/or Lu is replaced by Ce. This notation is known to the person skilled in the art. Ce will replace M in general for not more than 10%; in general, the Ce concentration will be in the range of 0.1-4%, especially 0.1-2% (relative to M). Assuming 1% Ce and 10% Y, the full correct formula could be $(Y_{0.1}Lu_{0.89}Ce_{0.01})_3Al_5O_{12}$. Ce in garnets is substantially or only in the trivalent state, as known to the person skilled in the art.

Red Emitting Phosphors for Use as Second Phosphor

Examples of a red emitting phosphor for use as second phosphor 202 include $(Ba,Sr,Ca)AlSiN_3:Eu$ and $(Ba,Sr,Ca)_2Si_{5-x}Al_xO_xN_{8-x}:Eu$: In these compounds, europium (Eu) is substantially or only divalent, and replaces one or more of the indicated divalent cations. In general, Eu will not be present in amounts larger than 10% of the cation, especially in the range of about 0.5-10%, more especially in the range of about 0.5-5% relative to the cation(s) it replaces. The term ":Eu" or ":Eu$^{2+}$", indicates that part of the metal ions is replaced by Eu (in these examples by Eu$^{2+}$). For instance, assuming 2% Eu in $CaAlSiN_3:Eu$, the correct formula could be $(Ca_{0.98}Eu_{0.02})AlSiN_3$. Divalent europium will in general replace divalent cations, such as the above divalent alkaline earth cations, especially Ca, Sr or Ba.

Further, the material $(BaSrCa)_2Si_{5-x}Al_xO_xN_{8-x}:Eu$ can also be indicated as $M_2Si_{5-x}Al_xO_xN_{8-x}:Eu$, where M is one or more elements selected from the group barium (Ba), strontium (Sr) and calcium (Ca); especially, M includes in this compound Sr and/or Ba. In a further specific embodiment, M consists of Sr and/or Ba (not taking into account the presence of Eu), especially 50-100%, especially 50-90% Ba and 50-0%, especially 50-10% Sr, such as $Ba_{1.5}Sr_{0.5}Si_5N_8:Eu$, (i.e. 75% Ba; 25% Sr). Here, Eu is introduced and replaces at least part of M i.e. one or more of Ba, Sr, and Ca). Likewise, the material $(Sr,Ca,Mg)AlSiN_3:Eu$ can also be indicated as $MAlSiN_3:Eu$ where M is one or more elements selected from the group magnesium (Mg) strontium (Sr) and calcium (Ca); especially, M includes in this compound calcium or strontium, or calcium and strontium, more especially calcium. Here, Eu is introduced and replaces at least part of M (i.e. one or more of Mg, Sr, and Ca). Preferably, in an embodiment the first red luminescent material includes $(Ca,Sr,Mg)AlSiN_3:Eu$, preferably $CaAlSiN_3:Eu$. Further, in another embodiment, which may be combined with the former, the first red luminescent material includes $(Ca,Sr,Ba)_2Si_{5-x}Al_xO_xN_{8-x}:Eu$, preferably $(Sr,Ba)_2Si_5N_8:Eu$. The terms "(Ca,Sr,Ba)" indicate that the corresponding cation may be occupied by calcium, strontium or barium. It also indicates that in such material corresponding cation sites may be occupied with cations selected from the group calcium, strontium and barium. Thus, the material may for instance comprise calcium and strontium, or only strontium, etc.

IR Emitting Phosphors for Use as Second Phosphor

Examples of an IR emitting phosphor for use as second phosphor 202 include langasite type phosphors of composition $RE_3Ga_{5-x-y}A_xSiO_{14}:Cr_y$ (RE=La, Nd, Gd, Yb, Tm; A=Al, Sc) and/or chromium doped garnets of composition $Gd_{3-x}RE_xSc_{2-y-z}Ln_yGa_{3-w}Al_wO_{12}:Cr_z$ (Ln=Lu, Y, Yb, Tm; RE=La, Nd), where $0 \leq x \leq 3$; $0 \leq y \leq 1.5$; $0 \leq z \leq 0.3$; and $0 \leq w \leq 2$, and/or one or more chromium doped colquiirite materials of composition $AAEM_{1-x}F_6:Cr_x$ (A=Li, Cu; AE=Sr, Ca; M=Al, Ga, Sc) where $0.005 \leq x \leq 0.2$, and/or one or more chromium doped tungstate materials of composition $A_{2-x}(WO_4)_3:Cr_x$ (A=Al, Ga, Sc, Lu, Yb) where $0.003 \leq x \leq 0.5$.

The wavelength converting structure 218 including NIR phosphor 208 and the second phosphor 202 described with respect to FIG. 2 can be manufactured, for example, in powder form, in ceramic form, or in any other suitable form. The NIR phosphor 208 and the second phosphor 202 may be formed into one or more structures that are formed separately from and can be handled separately from the light source, such as a prefabricated glass or ceramic tile, or may be formed into a structure that is formed in situ with the light source, such as a conformal or other coating formed on or above the source.

The NIR phosphor 208 and the second phosphor 202 may be mixed together in a single wavelength converting layer, or formed as separate wavelength converting layers. In a wavelength converting structure with separate wavelength converting layers, NIR phosphor 208 and the second phosphor 202 may be stacked such that the second phosphor 202 may be disposed between the NIR phosphor 208 and the light source, or the NIR phosphor 208 may be disposed between the second phosphor 202 and the light source.

In some embodiments, the NIR phosphor 208 and the second phosphor 202 may be powders that are dispersed for example in a transparent matrix, a glass matrix, a ceramic matrix, or any other suitable material or structure. Phosphor dispersed in a matrix may be, for example, singulated or formed into a tile that is disposed over a light source. The glass matrix may be for example a low melting glass with a softening point below 1000° C., or any other suitable glass or other transparent material. The ceramic matrix material can be for example a fluoride salt such as $CaF_2$ or any other suitable material.

The NIR phosphor 208 and second phosphor 202 may be used in powder form, for example by mixing the powder phosphor with a transparent material such as silicone and dispensing or otherwise disposing it in a path of light. In powder form, the average particle size (for example, particle diameter) of the phosphors may be at least 1 µm in some embodiments, no more than 50 µm in some embodiments, at least 5 µm in some embodiments, and no more than 20 µm in some embodiments. Individual phosphor particles, or powder phosphor layers, may be coated with one or more materials such as a silicate, a phosphate, and/or one or more oxides in some embodiments, for example to improve absorption and luminescence properties and/or to increase the material's functional lifetime.

Figure 3:
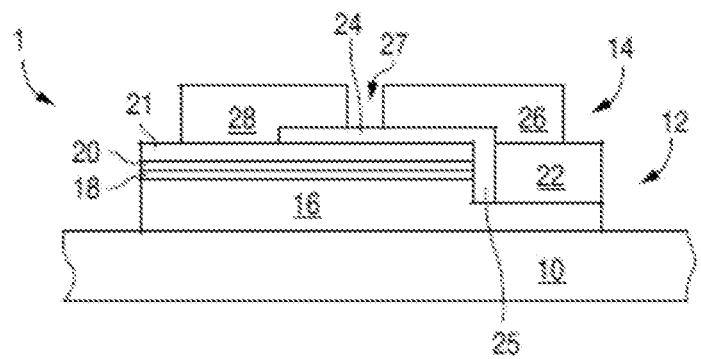
FIG. 3 is a cross sectional view of an LED.

As shown in FIGS. 1 and 2, an illumination device may include a wavelength converting structure that may be used, for example, with light source 100, 200. Light source 100, 200 may be a light emitting diode (LED). Light emitted by the light emitting diode is absorbed by the phosphors in the wavelength converting structure according to embodiments and emitted at a different wavelength. FIG. 3 illustrates one example of a suitable light emitting diode, a III-nitride LED that emits blue light for use in such an illumination system.

Though in the example below the semiconductor light emitting device is a III-nitride LED that emits blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used.

FIG. 3 illustrates a III-nitride LED 1 that may be used in embodiments of the present disclosure. Any suitable semiconductor light emitting device may be used and embodiments of the disclosure are not limited to the device illustrated in FIG. 3. The device of FIG. 3 is formed by growing a III-nitride semiconductor structure on a growth substrate 10 as is known in the art. The growth substrate is often sapphire but may be any suitable substrate such as, for example, SiC, Si, GaN, or a composite substrate. A surface of the growth substrate on which the III-nitride semiconductor structure is grown may be patterned, roughened, or textured before growth, which may improve light extraction from the device. A surface of the growth substrate opposite the growth surface (i.e. the surface through which a majority of light is extracted in a flip chip configuration) may be patterned, roughened or textured before or after growth, which may improve light extraction from the device.

The semiconductor structure includes a light emitting or active region sandwiched between n- and p-type regions. An n-type region 16 may be grown first and may include multiple layers of different compositions and dopant concentration including, for example, preparation layers such as buffer layers or nucleation layers, and/or layers designed to facilitate removal of the growth substrate, which may be n-type or not intentionally doped, and n- or even p-type device layers designed for particular optical, material, or electrical properties desirable for the light emitting region to efficiently emit light. A light emitting or active region 18 is grown over the n-type region. Examples of suitable light emitting regions include a single thick or thin light emitting layer, or a multiple quantum well light emitting region including multiple thin or thick light emitting layers separated by barrier layers. A p-type region 20 may then be grown over the light emitting region. Like the n-type region, the p-type region may include multiple layers of different composition, thickness, and dopant concentration, including layers that are not intentionally doped, or n-type layers.

After growth, a p-contact is formed on the surface of the p-type region. The p-contact 21 often includes multiple conductive layers such as a reflective metal and a guard metal which may prevent or reduce electromigration of the reflective metal. The reflective metal is often silver but any suitable material or materials may be used. After forming the p-contact 21, a portion of the p-contact 21, the p-type region 20, and the active region 18 is removed to expose a portion of the n-type region 16 on which an n-contact 22 is formed. The n- and p-contacts 22 and 21 are electrically isolated from each other by a gap 25 which may be filled with a dielectric such as an oxide of silicon or any other suitable material. Multiple n-contact vias may be formed; the n- and p-contacts 22 and 21 are not limited to the arrangement illustrated in FIG. 4. The n- and p-contacts may be redistributed to form bond pads with a dielectric/metal stack, as is known in the art.

In order to form electrical connections to the LED 1, one or more interconnects 26 and 28 are formed on or electrically connected to the n- and p-contacts 22 and 21. Interconnect 26 is electrically connected to n-contact 22 in FIG. 4. Interconnect 28 is electrically connected to p-contact 21. Interconnects 26 and 28 are electrically isolated from the n- and p-contacts 22 and 21 and from each other by dielectric layer 24 and gap 27. Interconnects 26 and 28 may be, for example, solder, stud bumps, gold layers, or any other suitable structure.

The substrate 10 may be thinned or entirely removed. In some embodiments, the surface of substrate 10 exposed by thinning is patterned, textured, or roughened to improve light extraction.

Any suitable light emitting device may be used in light sources according to embodiments of the disclosure. The invention is not limited to the particular LED illustrated in FIG. 4. The light source, such as, for example, the LED illustrated in FIG. 4, is illustrated in the following figures by block 1.

Figure 4:
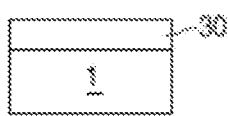
FIG. 4 is a cross sectional view of a device with a wavelength converting structure in direct contact with an LED.
Figure 5:
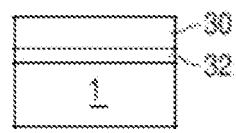
FIG. 5 is a cross sectional view of a device with a wavelength converting structure in close proximity to an LED.
Figure 6:
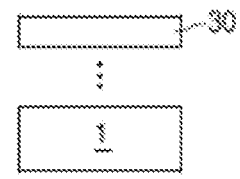
FIG. 6 is a cross sectional view of a device with a wavelength converting structure spaced apart from an LED.

FIGS. 4, 5, and 6 illustrate devices that combine an LED 1 and a wavelength converting structure 30. The wavelength converting structure 30 may be, for example, wavelength converting structure 108 including an NIR phosphor as shown in FIG. 1, or wavelength converting structure 218 having an NIR Phosphor and a second phosphor as shown in FIG. 2, according to the embodiments and examples described above.

In FIG. 4, the wavelength converting structure 30 is directly connected to the LED 1. For example, the wavelength converting structure may be directly connected to the substrate 10 illustrated in FIG. 4, or to the semiconductor structure, if the substrate 10 is removed.

In FIG. 5, the wavelength converting structure 30 is disposed in close proximity to LED 1, but not directly connected to the LED 1. For example, the wavelength converting structure 30 may be separated from LED 1 by an adhesive layer 32, a small air gap, or any other suitable structure. The spacing between LED 1 and the wavelength converting structure 30 may be, for example, less than 500 μm in some embodiments.

In FIG. 6, the wavelength converting structure 30 is spaced apart from LED 1. The spacing between LED 1 and the wavelength converting structure 30 may be, for example, on the order of millimeters in some embodiments. Such a device may be referred to as a "remote phosphor" device.

The wavelength converting structure 30 may be square, rectangular, polygonal, hexagonal, circular, or any other suitable shape. The wavelength converting structure may be the same size as LED 1, larger than LED 1, or smaller than LED 1.

Multiple wavelength converting materials and multiple wavelength converting structures can be used in a single device. Examples of wavelength converting structures include luminescent ceramic tiles; powder phosphors that are disposed in transparent material such as silicone or glass that is rolled, cast, or otherwise formed into a sheet, then singulated into individual wavelength converting structures; wavelength converting materials such as powder phosphors that are disposed in a transparent material such as silicone that is formed into a flexible sheet, which may be laminated or otherwise disposed over an LED 1, wavelength converting materials such as powder phosphors that are mixed with a transparent material such as silicone and dispensed, screen printed, stenciled, molded, or otherwise disposed over LED 1; and wavelength converting materials that are coated on LED 1 or another structure by electrophoretic, vapor, or any other suitable type of deposition.

A device may also include other wavelength converting materials in addition to the NIR phosphor and a second phosphor described above, such as, for example, conventional phosphors, organic phosphors, quantum dots, organic semiconductors, II-VI or III-V semiconductors, II-VI or III-V semiconductor quantum dots or nanocrystals, dyes, polymers, or other materials that luminesce.

The wavelength converting materials absorb light emitted by the LED and emit light of one or more different wavelengths. Unconverted light emitted by the LED is often part of the final spectrum of light extracted from the structure, though it need not be. Wavelength converting materials emitting different wavelengths of light may be included to tailor the spectrum of light extracted from the structure as desired or required for a particular application.

Multiple wavelength converting materials may be mixed together or formed as separate structures.

In some embodiments, other materials may be added to the wavelength converting structure or the device, such as, for example, materials that improve optical performance, materials that encourage scattering, and/or materials that improve thermal performance.

Examples

1) Synthesis of $Sc_{0.98-x}Lu_xBO_3:Cr_{0.02}$ (x=0, 0.2, 0.3)

Compositions of $Sc_{0.98-x}Lu_xBO_3:Cr_{0.02}$ (in which x=0, 0.2, 0.3) were synthesized from powders of $Sc_2O_3$ (5N) obtained from MRE Ltd., $Lu_2O_3$ (4N) obtained from Rhodia, $Cr_2O_3$ (2N) obtained from Alfa Aesar and $(NH_4)_2B_{10}O_{16}*4H_2O$ obtained from Alfa Aesar following the recipes set forth in Table 2:

TABLE 2 recipes for synthesis of $Sc_{0.98-x}Lu_xBO_3:Cr_{0.02}$ (x = 0, 0.2, 0.3)

| | amounts in gram | | | |
|---|---|---|---|---|
| X | $Sc_2O_3$ (5N) | $Lu_2O_3$ (4N) | $Cr_2O_3$ (2N) | $(NH_4)_2B_{10}O_{16}*4H_2O$ |
| 0 | 65.124 | 0.0 | 1.465 | 56.887 |
| 0.2 | 51.833 | 38.349 | 1.465 | 56.887 |
| 0.3 | 45.188 | 57.524 | 1.465 | 56.887 |

The powders of the $Sc_2O_3$ (4N), $Lu_2O_3$ (4N), $Cr_2O_3$ (2N), and $(NH_4)_2B_{10}O_{16}*4H_2O$ were weighed out according to the amounts shown in Table 2 for each of the x=0, 0.2 and 0.3 $Sc_{0.98-x}Lu_xBO_3:Cr_{0.02}$ phosphors and combined. Each mixture was then ball mixed in ethanol and fired at 1350° C. for 10 h after drying. After milling, sedimentation from water and screening, phosphor powders of each of $Sc_{0.98-x}Lu_xBO_3:Cr_{0.02}$ (in which x=0, 0.2, 0.3) were obtained. All powders crystallize in the calcite structure type. Table 3 summarizes the structure and emission properties of each of the resulting $Sc_{0.98-x}Lu_xBO_3:Cr_{0.02}$ (in which x=0, 0.2, 0.3) powders:

TABLE 3

Lattice constants and emission properties of $Sc_{0.98-x}Lu_xBO_3:Cr_{0.02}$ (x = 0, 0.2, 0.3)

| X | a (Å) | c (Å) | Emission centroid wavelength (nm) | Emission FWHM (nm) |
|---|---|---|---|---|
| 0 | 4.7538 | 15.2831 | 843.85 | 140.75 |
| 0.2 | 4.7810 | 15.4483 | 863.12 | 158.28 |
| 0.3 | 4.7943 | 15.5262 | 863.29 | 169.61 |

Figure 7:
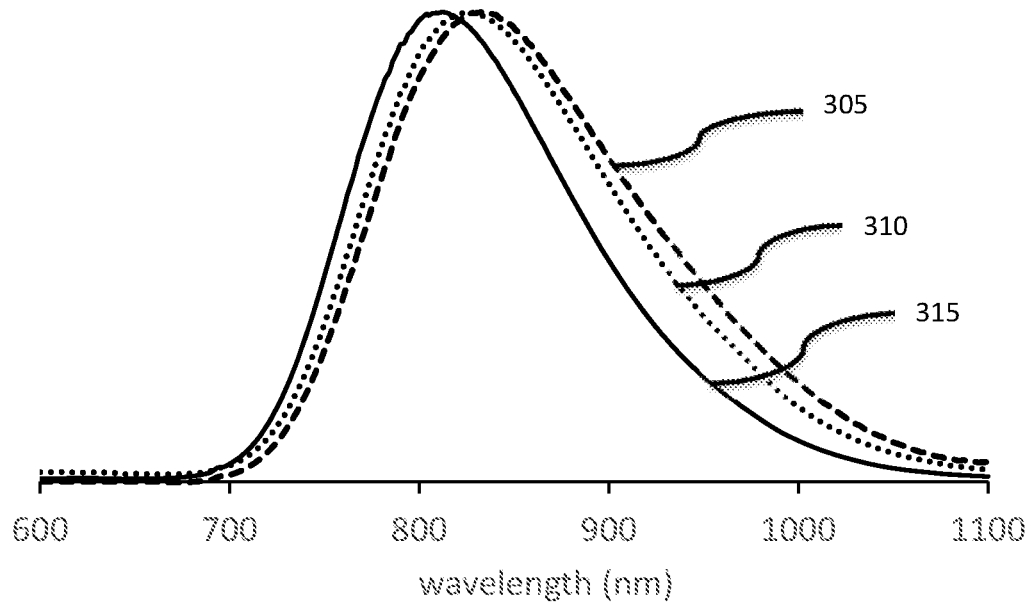
FIG. 7 shows the emission spectra of each of the $Sc_{0.98-x}Lu_xBO_3:Cr_{0.02}$ (x=0, 0.2, 0.3) phosphors under excitation of blue light (443 nm).

FIG. 7 shows the emission spectra of each of the $Sc_{0.98-x}Lu_xBO_3:Cr_{0.02}$ (x=0, 0.2, 0.3) phosphors under excitation of blue light (443 nm). Curve 305 is the emission spectra of $Sc_{0.98-x}Lu_xBO_3:Cr_{0.02}$ where x=0.3. Curve 310 is the emission spectra of $Sc_{0.98-x}Lu_xBO_3:Cr_{0.02}$ where x=0.2. Curve 315 is the emission spectra of $Sc_{0.98-x}Lu_xBO_3:Cr_{0.02}$ where x=0.

2) Synthesis of $Sc_{1-x}P_3O_9:Cr_x$ (x=0.02, 0.04, 0.08)

Compositions of $Sc_{1-x}P_3O_9:Cr_x$ (in which x=0.02, 0.04, 0.08) phosphors were synthesized from powders of $Sc_2O_3$ (5N) obtained from MRE Ltd., $Cr_2O_3$ (2N) obtained from Alfa Aesar and $(NH_4)H_2PO_4$ obtained from Merck following the recipes set forth in Table 4:

TABLE 4 recipes for synthesis of $Sc_{1-x}P_3O_9:Cr_x$ (x = 0.02, 0.04, 0.08)

| | amounts in gram | | |
|---|---|---|---|
| X | $Sc_2O_3$ (5N) | $Cr_2O_3$ (2N) | $NH_4H_2PO_4$ |
| 0.02 | 47.92 | 1.08 | 281.43 |
| 0.04 | 46.95 | 2.16 | 281.43 |
| 0.08 | 44.99 | 4.31 | 281.43 |

The powders of the $Sc_2O_3$ (4N), $Cr_2O_3$ (2N), and $(NH_4)H_2PO_4$ were weighed out according to the amounts shown in Table 4 for each of the x=0.02, 0.04, 0.08 $Sc_{1-x}P_3O_9$:$Cr_x$ phosphors. The powders were dry mixed by means of ball milling followed by firing at 600° C. for 8 hours in air. After intermediate grinding, the powders were re-fired at 800° C. for 8 hours in air. Finally, the obtained raw phosphor powders were washed with water, dried, milled by means of ball milling, and screened.

Figure 8:
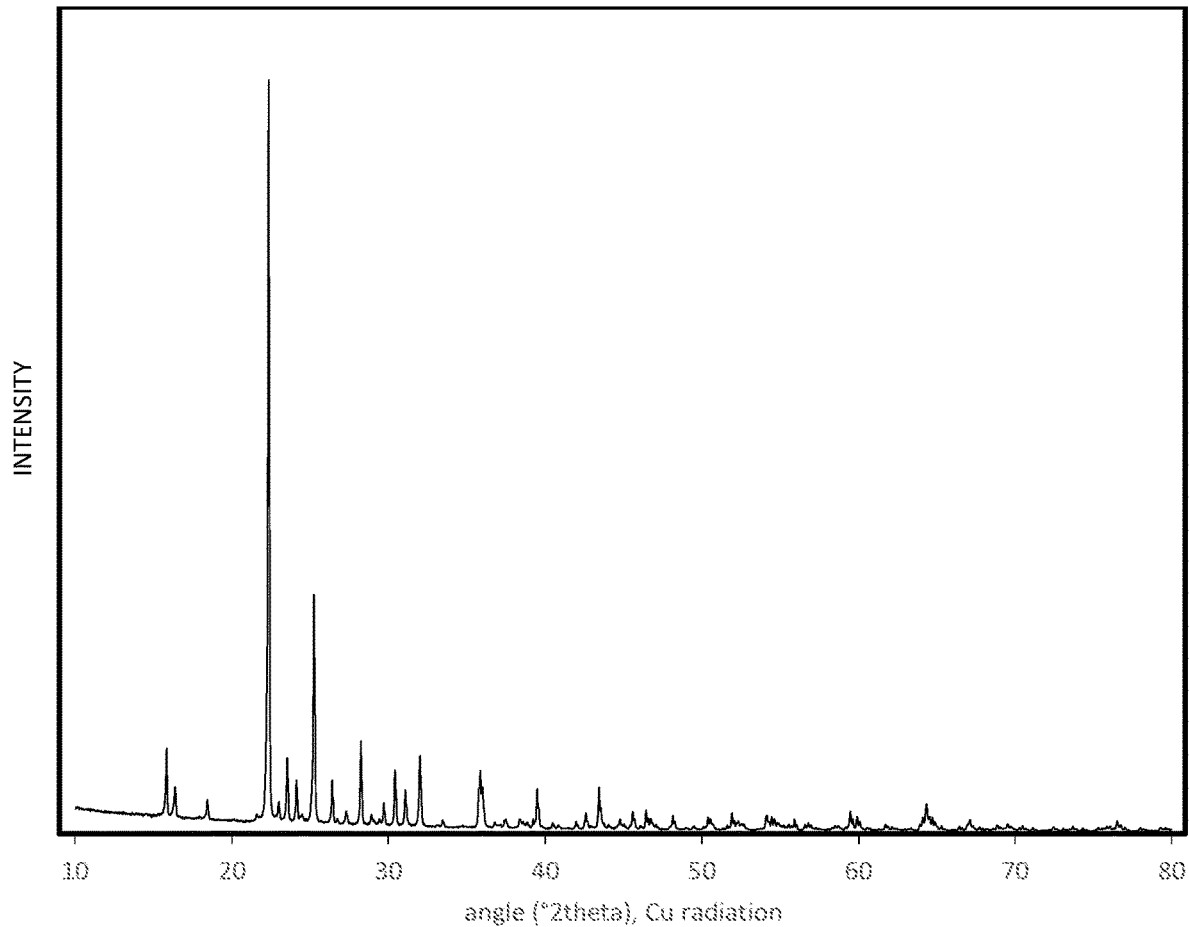
FIG. 8 shows the powder x-ray diffraction (XRD) pattern of the $Sc_{0.96}P_3O_9:Cr_{0.04}$ phosphor.

FIG. 8 shows the powder x-ray diffraction (XRD) pattern of the $Sc_{0.96}P_3O_9$:$Cr_{0.04}$ phosphor. The phosphor is single phase and crystallizes in the C phase polyphosphate structure (space group C 1 c 1).

Table 5 summarizes lattice constants and emission properties of each of the resulting $Sc_{1-x}P_3O_9$:$Cr_x$ (in which x=0.02, 0.04, 0.08) powders.

TABLE 5

Lattice constants and Emission properties of $Sc_{1-x}P_3O_9$:$Cr_{0.04}$ (x = 0.02, 0.04, 0.08)

| X | a (Å) | b (Å) | c (Å) | β (°) | Emission centroid wavelength (nm) | Emission FWHM (nm) |
|---|---|---|---|---|---|---|
| 0.02 | 13.5597 | 19.5407 | 9.6925 | 127.2 | 908.29 | 165.09 |
| 0.04 | 13.5525 | 19.5326 | 9.6864 | 127.2 | 910.39 | 165.51 |
| 0.08 | 13.5322 | 19.5090 | 9.6718 | 127.2 | 911.17 | 167.02 |

Figure 9:
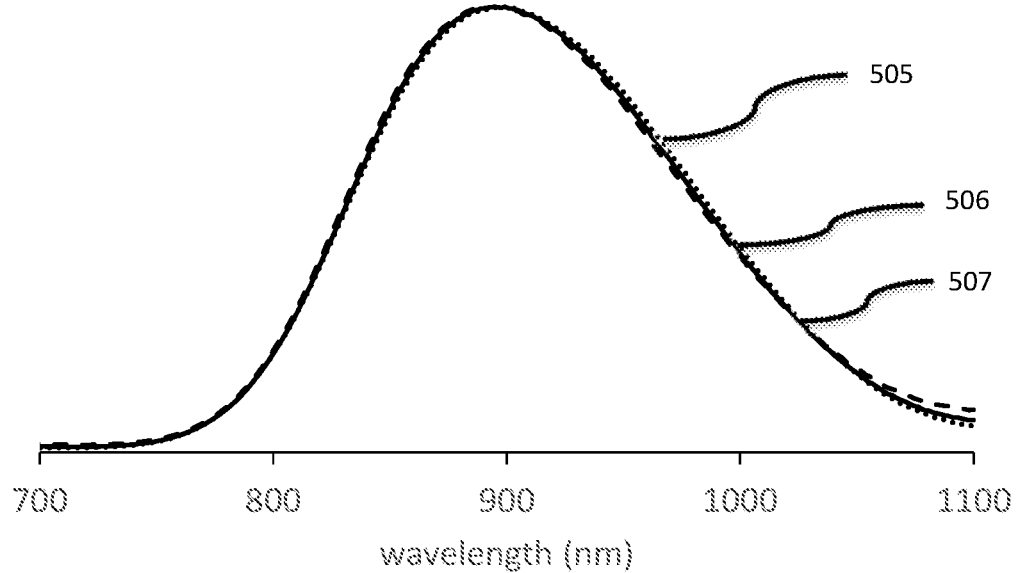
FIG. 9 shows the emission spectra of each of the $Sc_{1-x}P_3O_9:Cr_{0.04}$ (x=0.02, 0.04, 0.08) phosphors under excitation of blue light (443 nm).

FIG. 9 shows the emission spectra of each of the $Sc_{1-x}P_3O_9$:$Cr_{0.04}$ (x=0.02, 0.04, 0.08) phosphor powders under excitation of blue light (443 nm). Curve 505 is the emission spectra of $Sc_{1-x}P_3O_9$:$Cr_{0.04}$ where x=0.02. Curve 506 is the emission spectra of $Sc_{1-x}P_3O_9$:$Cr_{0.04}$ where x=0.04. Curve 507 is the emission spectra of $Sc_{1-x}P_3O_9$:$Cr_{0.04}$ where x=0.08. Note that the emission spectra are very similar for each compound.

3) Synthesis of $Sc_{2-x-y}Ga_yBP_3O_{12}$:$Cr_x$ (x=0.04, y=0.0; x=0.08, y=0.0; x=0.8, y=0.96)

Compositions of $Sc_{2-x-y}Ga_yBP_3O_{12}$:$Cr_x$ in which (x=0.04, y=0.0; x=0.08, y=0.0; x=0.8, y=0.96) were synthesized from powders of $Sc_2O_3$ (5N) obtained from MRE Ltd., $Ga_2O_3$ (4N, UHP grade) obtained from Molycorp, $Cr_2O_3$ (2N) obtained from Alfa Aesar, $(NH_4)H_2PO_4$ obtained from Merck, and $(NH_4)_2B_{10}O_{16}*4H_2O$ obtained from Alfa Aesar following the recipes set forth in Table 6:

TABLE 6 recipes for synthesis of $Sc_{2-x-y}Ga_yBP_3O_{12}$:$Cr_x$

| | amounts in gram | | | | |
|---|---|---|---|---|---|
| x/y | $Sc_2O_3$ (5N) | $Ga_2O_3$ (4N) | $Cr_2O_3$ (2N) | $NH_4H_2PO_4$ | $(NH_4)_2B_{10}O_{16}*4H_2O$ |
| 0.04/0.0 | 70.093 | 0.0 | 1.577 | 205.809 | 30.614 |
| 0.08/0.0 | 68.662 | 0.0 | 3.153 | 205.809 | 30.614 |
| 0.08/0.96 | 31.049 | 42.201 | 2.852 | 186.133 | 28.794 |

The powders of the $Sc_2O_3$ (4N), $Ga_2O_3$ (4N), $Cr_2O_3$ (2N), $(NH_4) H_2PO_4$, and $(NH_4)_2B_{10}O_{16}*4H_2O$ weighed out according to the amounts shown in Table 6 for each of the x=0.04, y=0.0; x=0.08, y=0.0; x=0.8, y=0.96 $Sc_{2-x-y}Ga_yBP_3O_{12}$:$Cr_x$ phosphors were combined. The powder mixtures according to the recipes given in Table 6 were then obtained by ball milling. Firing was carried out at 600° C. for 8 hours followed by powderization. After a second firing at 1200° C., the raw phosphor was ball milled and screened.

Figure 10:
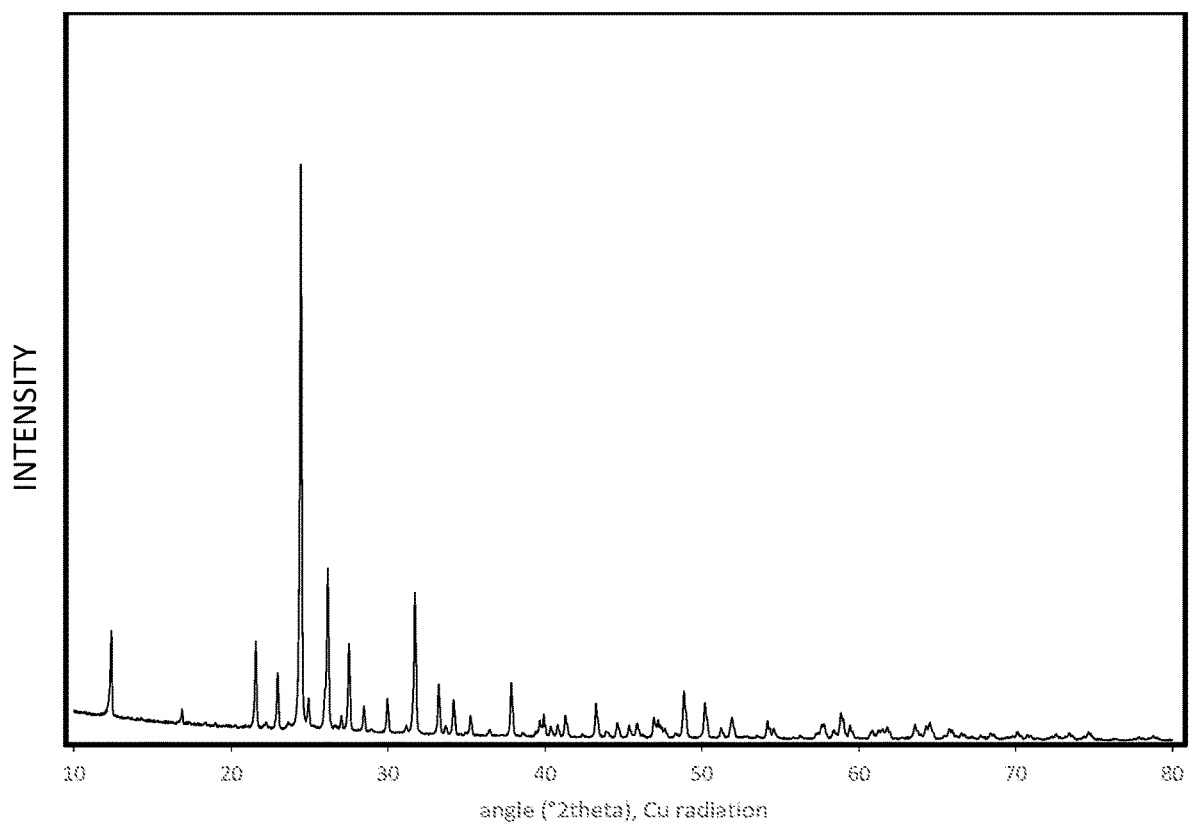
FIG. 10 shows the X-ray powder diffraction patterns of the $Sc_{1.96}BP_3O_{12}:Cr_{0.04}$ phosphor.

FIG. 10 shows the X-ray powder diffraction patterns of the resulting $Sc_{1.96}BP_3O_{12}$:$Cr_{0.04}$. The pattern shows that the $Sc_{1.96}BP_3O_{12}$:$Cr_{0.04}$ material crystalized hexagonally in the crystallographic space group P $6_3$/m (No 176), isotypic with $V_2BP_3O_{12}$.

Table 7 summarizes the lattice constants and emission properties of each of the $Sc_{2-x-y}Ga_yBP_3O_{12}$:$Cr_x$ in which (x=0.04, y=0.0; x=0.08, y=0.0; x=0.8, y=0.96) phosphors under blue light excitation.

TABLE 7

Lattice constants and emission properties of $Sc_{2-x-y}Ga_yBP_3O_{12}$:$Cr_x$

| x/y | a (Å) | c (Å) | Emission centroid wavelength (nm) | Emission FWHM (nm) |
|---|---|---|---|---|
| 0.04/0.0 | 14.2294 | 7.7240 | 931.92 | 171.3 |
| 0.08/0.0 | 14.2233 | 7.7153 | 936.02 | 169.82 |
| 0.8/0.96 | 14.1554 | 7.6408 | 933.12 | 173.46 |

Figure 11:
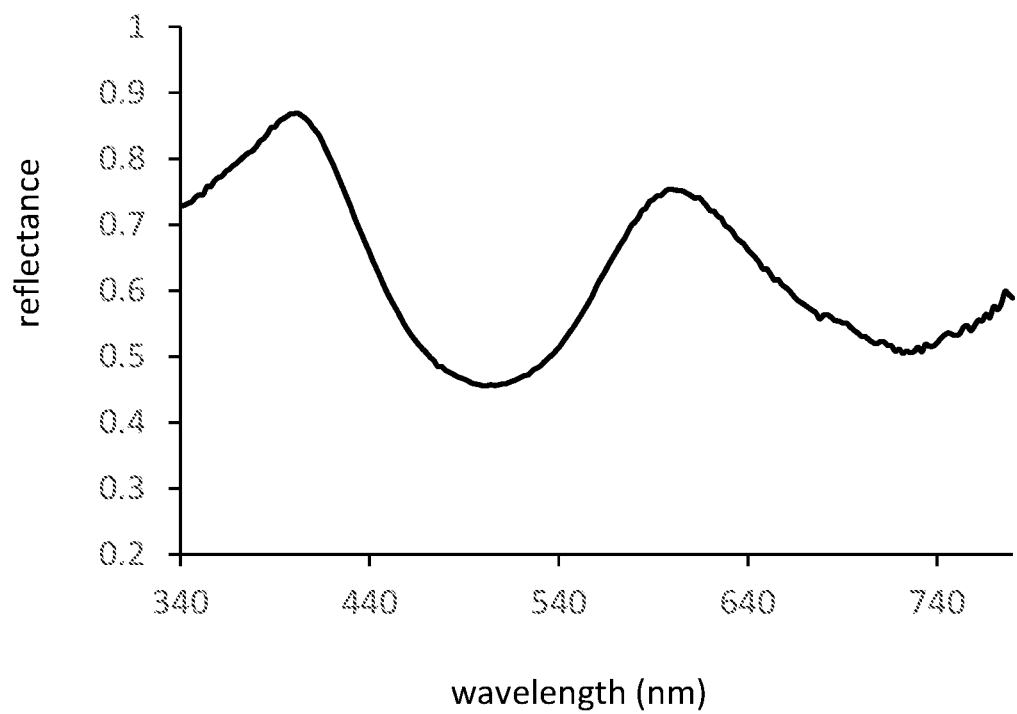
FIG. 11 shows the diffuse reflectance of $Sc_{1.92}BP_3O_{12}:Cr_{0.08}$ phosphor powder.
Figure 12:
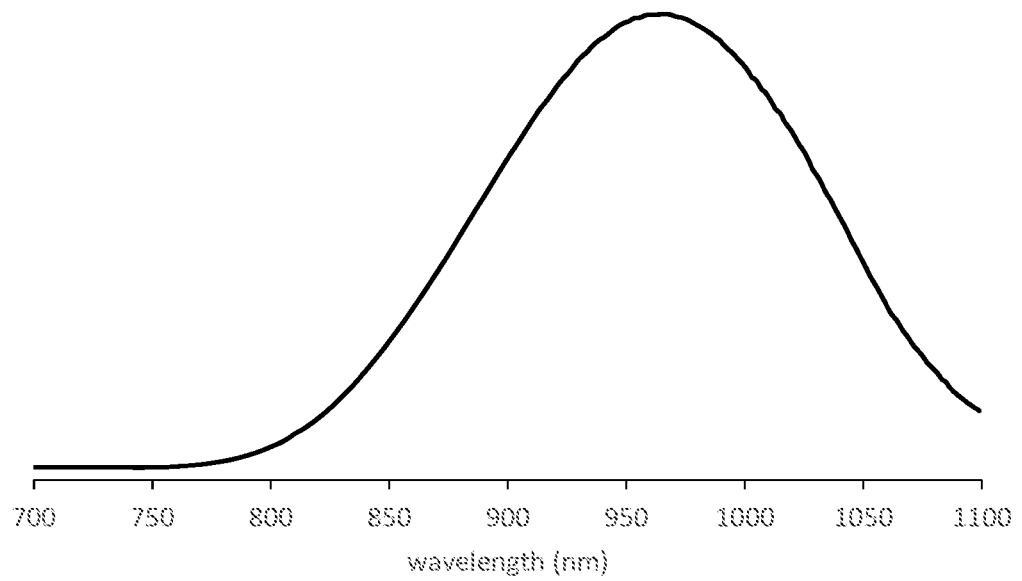
FIG. 12 shows the emission spectra of $Sc_{1.92}BP_3O_{12}:Cr_{0.08}$ under excitation at 443 nm.

As examples, FIG. 11 shows the diffuse reflectance of $Sc_{1.92}BP_3O_{12}$:$Cr_{0.08}$ phosphor powder, and FIG. 12 shows the emission spectra of $Sc_{1.92}BP_3O_{12}$:$Cr_{0.08}$ under excitation at 443 nm.

4) Synthesis of $Sc_{2.88}SiP_5O_{19}$:$Cr_{0.12}$

Compositions of $Sc_{2.88}SiP_5O_{19}$:$Cr_{0.12}$ were synthesized from powders of $Sc_2O_3$ (5N, obtained from MRE Ltd.), $Cr_2O_3$ (2N, obtained from Alfa Aesar), $SiO_2$ (Aerosil®, obtained from Evonik) and $NH_4H_2PO_4$ (p.a., obtained from Merck) following the recipe set forth in Table 8.

TABLE 8

| Powder | $Sc_2O_3$ | $Cr_2O_3$ | $SiO_2$ | $NH_4H_2PO_4$ |
|---|---|---|---|---|
| Amount in grams | 63.875 | 2.933 | 23.309 | 188.685 |

The powders of $Sc_2O_3$, $Cr_2O_3$, $SiO_2$, and $NH_4H_2PO_4$ weighed out according to the amounts in Table 8 were mixed and fired in air at 600° C. After grinding, the mixture was further fired under CO atmosphere at 1350° C. for 4 hrs. The resulting powder phosphor was ball milled and washed with water, followed by drying.

Figure 13:
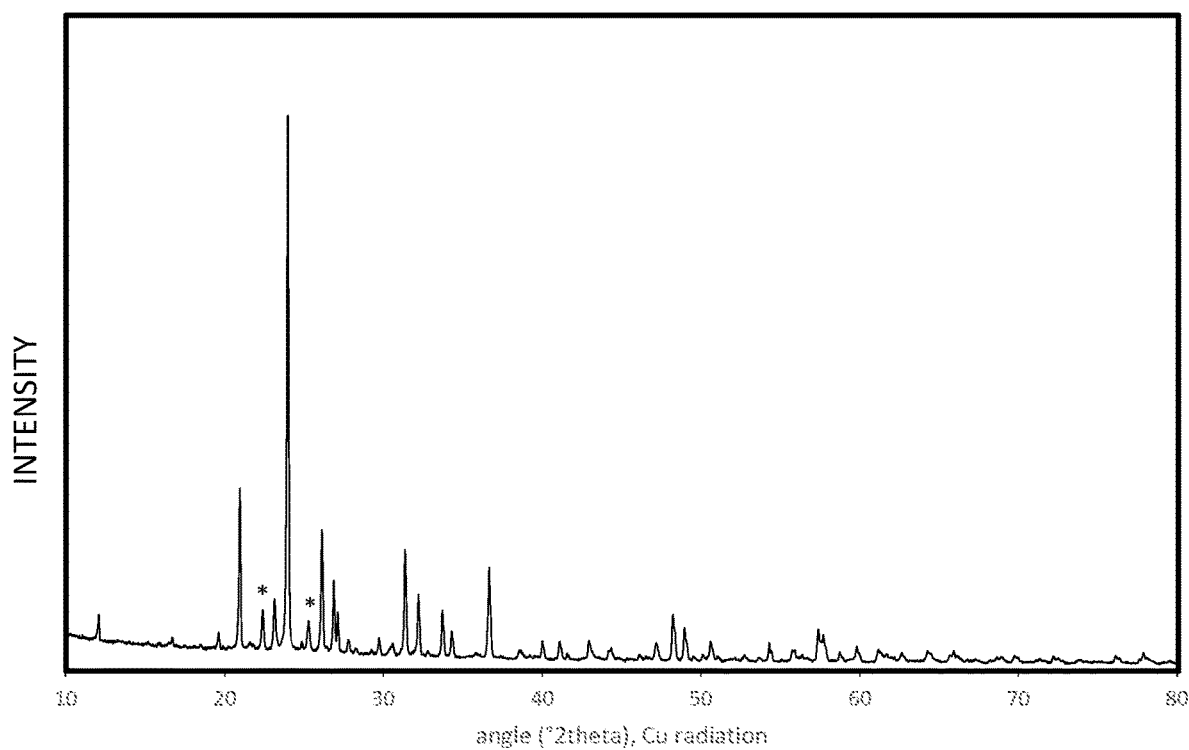
FIG. 13 shows the X-ray powder diffraction pattern of the $Sc_{2.88}SiP_5O_{19}:Cr_{0.12}$ phosphor.
Figure 14:
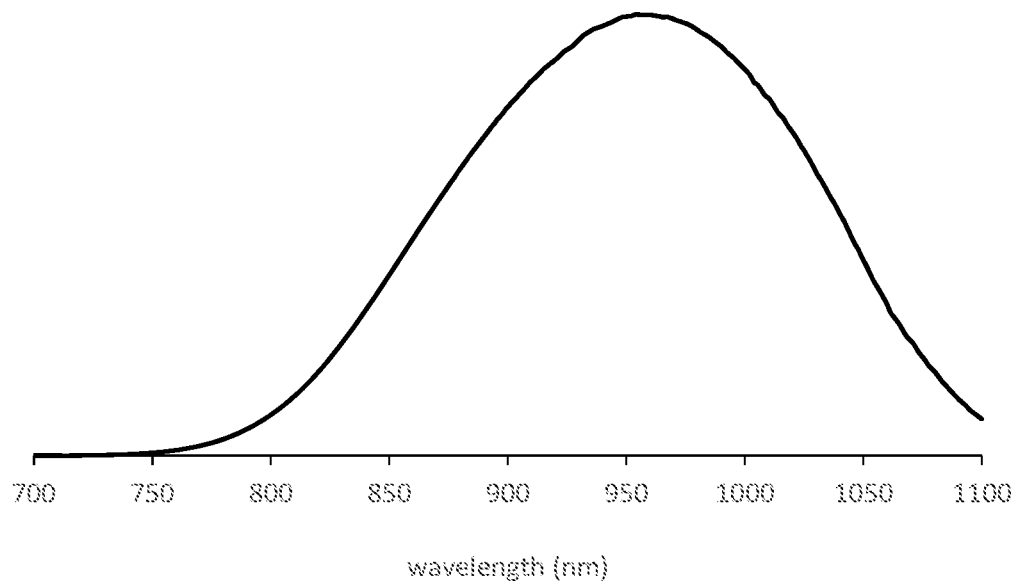
FIG. 14 shows the emission spectrum of $Sc_{2.88}SiP_5O_{19}:Cr_{0.12}$ under excitation at 443 nm.

FIG. 13 shows the powder X-ray diffraction pattern of the sample of $Sc_{2.88}SiP_5O_{19}$:$Cr_{0.12}$. $Sc_{2.88}SiP_5O_{19}$:$Cr_{0.12}$ crystallizes in the $V_3SiP_5O_{12}$ structure type (Space group P $6_3$, No. 173) with lattice constants $a_0$=14.713 Å and $c_0$=7.702 Å. The reflections marked with an asterisk (*) in FIG. 13 belong to $ScP_3O_9$ as an impurity phase. FIG. 14 is the corresponding emission spectrum of the $Sc_{2.88}SiP_5O_{19}$:$Cr_{0.12}$ under 443 nm excitation.

5) Illumination Device with a Wavelength Converting Structure Including an NIR Phosphor A wavelength converting structure including the NIR phosphors was formed and included in an illumination device. To form the wavelength converting structure, 5 wt % $Sc_{0.98}BO_3:Cr_{0.02}$ and 95 wt % $Sc_{1.92}BP_3O_{12}:Cr_{0.08}$ were mixed into a curable silicone polymer. The mixture was filled into leadframe packages containing 450 nm emitting InGaN LEDs with a phosphor/silicone weight ratio of 2 to form the pc NIR LED illumination device.

Figure 15:
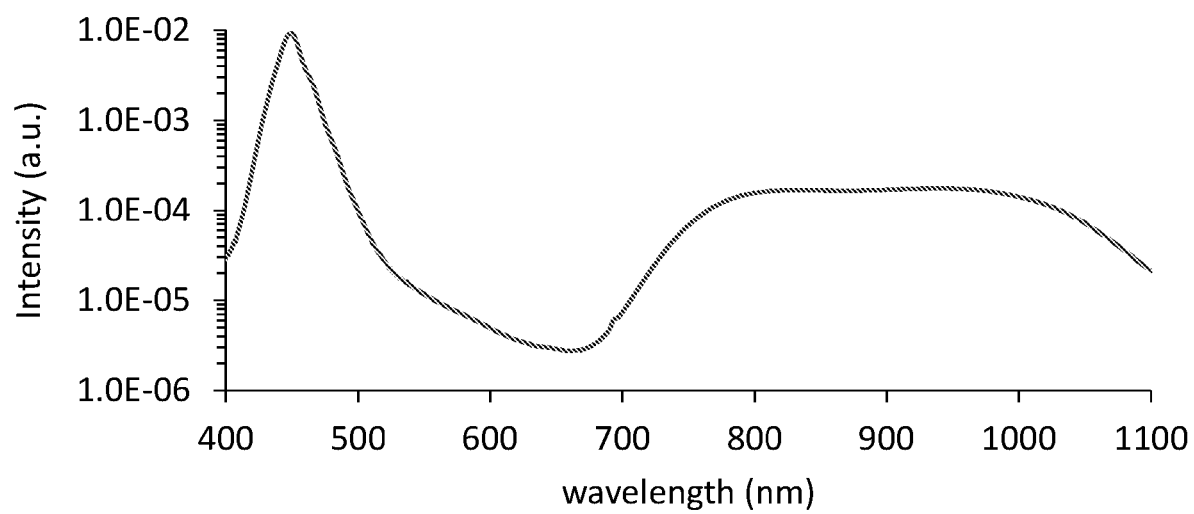
FIG. 15 shows the EL spectrum of a pcLED having a wavelength converting structure containing a disclosed NIR phosphor.

FIG. 15 shows an EL spectrum of the obtained pc NIR LED. The EL spectrum is characterized by an even spectral power distribution in the 750-1050 nm range.

6) Synthesis of Sc0.78In0.2BO3:Cr0.02

5.183 g scandium oxide (MRE Ltd., 4N), 0.146 g chromium (III) oxide (Alfa Aesar, 99%), 5.691 g ammonium borate hydrate (NH4)2B10O16*4 H2O (Alfa Aesar, 98%) and 3.837 g indium oxide (Auer Remy, 5N) are mixed by planetary ball milling and fired at 1200° C. for 10 hrs in a covered alumina crucible. After grinding, washing with water and ethanol and final screening the powder phosphor was obtained. X-ray diffraction shows that the material crystallizes in the calcite structure type. The following Table 9 lists lattice constants and emission properties.

TABLE 9

| a (Å) | c (Å) | Emission centroid wavelength (nm) | Emission FWHM (nm) |
|---|---|---|---|
| 4.7752 | 15.3411 | 845.19 | 142.68 |

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. A single element or other unit may fulfill the functions of several items recited in the claims. The mere fact that certain measures are recited in mutually different dependent claims does not indicate that a combination of these measures cannot be used to advantage.

Any (later) reference signs in the claims should not be construed as limiting the scope.

The following enumerated clauses provide additional non-limiting aspects of the disclosure.

1. A luminescent material comprising $Sc_{1-x-y}A_yMO:Cr_x$, wherein $MO=P_3O_9$, $(BP_3O_{12})_{0.5}$, $(SiP_5O_{19})_{0.34}$; A=Lu, In, Yb, Tm, Y, Ga, Al, where $0<x\le0.75$, $0\le y\le1$.
2. The luminescent material of clause 1, wherein MO is $P_3O_9$ and $0<x\le0.5$, $0\le y\le0.9$.
3. The luminescent material according to any one of the preceding clauses, comprising $Sc_{2-x-y}A_yBP_3O_{12}:Cr_x$, wherein A=Lu, In, Yb, Tm, Y, Ga, Al; $0<x\le0.75$, $0\le y\le1.8$.
4. The luminescent material according to any one of the preceding clauses, comprising $Sc_{3-x-y}A_ySiP_5O_{19}:Cr_x$, wherein A=Lu, In, Yb, Tm, Y, Ga, Al; $0<x\le0.2$, $0\le y\le2$.
5. The luminescent material according to any one of the preceding clauses, wherein the luminescent material emits light having a peak wavelength in a range of 700 nm to 1100 nm.
6. A wavelength converting structure comprising an NIR phosphor material, the NIR phosphor material including at least one of $Sc_{1-x-y}A_yMO:Cr_x$, wherein $MO=BO_3$, $P_3O_9$, $(BP_3O_{12})_{0.5}$, $(SiP_5O_{19})_{0.34}$; A=Lu, In, Yb, Tm, Y, Ga, Al, where $0<x\le0.75$, $0\le y\le1$, and wherein when $MO=BO_3$, $0<y$.
7. The wavelength converting structure of clause 6, further comprising a light source emitting a first light, the wavelength converting structure disposed in a path of the first light, wherein the NIR phosphor absorbs the first light and emits a second light, the second light having a wavelength range of 700 nm to 1100 nm.
8. The wavelength converting structure according to any one of the preceding clauses 6-7, further comprising a second phosphor material, wherein the second phosphor material includes at least one of a green phosphor, a red phosphor, and an IR phosphor.
9. The wavelength converting structure according to any one of the preceding clauses 6-8, wherein MO is $P_3O_9$ and $0<x\le0.5$, $0\le y\le0.9$.
10. The wavelength converting structure according to any one of the preceding clauses 6-9, wherein the NIR phosphor comprises $Sc_{2-x-y}A_yBP_3O_{12}:Cr_x$, wherein A=Lu, In, Yb, Tm, Y, Ga, Al; $0<x\le0.75$, $0\le y\le1.8$.
11. The wavelength converting structure according to any one of the preceding clauses 6-10, wherein the NIR phosphor comprises $Sc_{3-x-y}A_ySiP_5O_{19}:Cr_x$, wherein A=Lu, In, Yb, Tm, Y, Ga, Al; $0<x\le0.2$, $0\le y\le2$.
12. The wavelength converting structure according to any one of the preceding clauses 6-11, wherein MO is $BO_3$, $0<x\le0.5$, $y>0$ and $y\le0.9$.
13. The wavelength converting structure according to any one of the preceding clauses 6-12, wherein the MO is $BO_3$, A is Lu and $0.05\le y\le0.25$ and $0.01\le x\le0.06$.
14. The wavelength converting structure according to any one of the preceding clauses 6-13, wherein the NIR phosphor includes at least one of $Sc_{0.98-x}Lu_xBO_3:Cr_{0.02}$ (x=0, 0.2, 0.3), $Sc_{1-x}P_3O_9:Cr_x$ (x=0.02, 0.04, 0.08), $Sc_{2-x-y}Ga_yBP_3O_{12}:Cr_x$ (x=0.04, y=0.0; x=0.08, y=0.0; x=0.8, y=0.96), and $Sc_{2.88}SiP_5O_{19}:Cr_{0.12}$.
15. The wavelength converting structure according to any one of the preceding clauses 6-14, wherein the NIR phosphor includes 5 wt % $Sc_{0.98}BO_3:Cr_{0.02}$ and 95 wt % $Sc_{1.92}BP_3O_{12}:Cr_{0.08}$.

The invention claimed is:

1. A wavelength converting structure comprising an NIR phosphor material, the NIR phosphor material comprising $Sc_{1-x-y}A_yBO_3:Cr_x$, where A=In, Yb, Tm, Ga, or a mixture thereof and where $0<x\le0.75$, $0<y\le1$.

2. The wavelength converting structure of claim 1, wherein A=In.

3. The wavelength converting structure according to claim 1, further comprising a second phosphor material, wherein the second phosphor material includes at least one of a green phosphor, a red phosphor, and an IR phosphor.

4. The wavelength converting structure of claim 1, wherein $x\le0.5$ and $y\le0.9$.

5. The wavelength converting structure of claim 2, wherein $x\le0.5$ and $y\le0.9$.

6. The wavelength converting structure of claim 1, wherein the NIR phosphor material emits light having a peak wavelength in a range of 700 nm to 1100 nm.

7. A light emitting device comprising:
a light source emitting a first light; and
the wavelength converting structure of claim 1 disposed in a path of the first light, the NIR phosphor in the wavelength converting structure emitting a second light having a wavelength range of 700 nm to 1100 nm in response to absorbing first light.

8. The light emitting device of claim 7, wherein the wavelength converting structure comprises a second phosphor material that includes at least one of a green phosphor, a red phosphor, and an IR phosphor.

9. A luminescent material comprising $Sc_{1-x-y}Tm_yBO_3:Cr_x$, where $0<x\leq0.75$, $0<y\leq1$.

10. The luminescent material of claim 9, wherein $x\leq0.5$ and $y\leq0.9$.

11. The luminescent material of claim 9, wherein the luminescent material emits light having a peak wavelength in a range of 700 nm to 1100 nm.

12. A light emitting device comprising:
a light source emitting a first light; and
the luminescent material of claim 9 disposed in a path of the first light, the luminescent material emitting a second light having a wavelength range of 700 nm to 1100 nm in response to absorbing first light.

13. The light emitting device of claim 12, wherein the light emitting device comprises a second phosphor material that includes at least one of a green phosphor, a red phosphor, and an IR phosphor.

* * * * *